US009127126B2

(12) United States Patent
Hong et al.

(10) Patent No.: US 9,127,126 B2
(45) Date of Patent: Sep. 8, 2015

(54) DEVELOPMENT OF HIGH-VISCOSITY BONDING LAYER THROUGH IN-SITU POLYMER CHAIN EXTENSION

(75) Inventors: Wenbin Hong, Ballwin, MO (US); Tony D. Flaim, St. James, MO (US); Rama Puligadda, Rolla, MO (US); Susan Bailey, Rolla, MO (US)

(73) Assignee: Brewer Science Inc., Rolla, MO (US)

(*) Notice: Subject to any disclaimer, the term of this patent is extended or adjusted under 35 U.S.C. 154(b) by 555 days.

(21) Appl. No.: 13/460,372

(22) Filed: Apr. 30, 2012

(65) Prior Publication Data
US 2013/0288058 A1 Oct. 31, 2013

(51) Int. Cl.
| | |
|---|---|
| *H01L 21/00* | (2006.01) |
| *B31B 1/60* | (2006.01) |
| *C08G 73/02* | (2006.01) |
| *H01L 21/683* | (2006.01) |
| *H01L 21/20* | (2006.01) |
| *C09J 5/00* | (2006.01) |
| *B32B 15/08* | (2006.01) |

(52) U.S. Cl.
CPC .............. *C08G 73/0233* (2013.01); *C09J 5/00* (2013.01); *H01L 21/2007* (2013.01); *H01L 21/6835* (2013.01); *H01L 21/6836* (2013.01); *B32B 15/08* (2013.01); *C09J 2203/326* (2013.01); *C09J 2205/302* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01); *Y10T 156/10* (2015.01); *Y10T 428/31515* (2015.04); *Y10T 428/31551* (2015.04); *Y10T 428/31725* (2015.04); *Y10T 428/31786* (2015.04)

(58) Field of Classification Search
CPC ................. B23B 7/12; C09J 5/00; C09J 5/06; C09J 2205/302; H01L 21/6836; H01L 2221/68386; H01L 21/2007; H01L 2221/68318; C08G 73/0233; B32B 15/08
See application file for complete search history.

(56) References Cited

U.S. PATENT DOCUMENTS

| | | |
|---|---|---|
| 3,476,712 A | 9/1966 | Fukui et al. |
| 3,862,262 A | 1/1975 | Hendrick et al. |
| 4,031,164 A | 6/1977 | Hedrick et al. |
| 5,068,143 A | 11/1991 | Agger et al. |
| 5,136,016 A | 8/1992 | Singh et al. |
| 5,140,096 A | 8/1992 | Dunlap |
| 5,563,193 A | 10/1996 | Abel et al. |

(Continued)

OTHER PUBLICATIONS

C. Brubaker et al., "Advances in Processing of Compound Semiconductor Substrates," MANTECH 2005, pp. 261-264.

(Continued)

*Primary Examiner* — Alonzo Chambliss
(74) *Attorney, Agent, or Firm* — Hovey Williams LLP (57) ABSTRACT

New compositions and methods of using those compositions as bonding compositions for temporary wafer bonding are provided. The compositions are used to temporarily bond an active wafer to a carrier wafer or substrate in microelectronic fabrication using an in situ polymerization reaction of the components of the bonding composition to yield the bonding layer. The compositions form polymerized bonding layers that are mechanically strong and thermally resistant, but allow the wafers to be separated at the appropriate stage in the fabrication process. The bonding layer also retains its solubility so that residue can be cleaned from the debonded wafers using simple wet methods rather than etching or other harsh treatments.

30 Claims, 3 Drawing Sheets

(56) References Cited

U.S. PATENT DOCUMENTS

| | | | |
|---|---|---|---|
| 5,977,283 | A | 11/1999 | Rossitto |
| 6,051,294 | A | 4/2000 | White et al. |
| 6,541,033 | B1 | 4/2003 | Shah |
| 7,534,498 | B2 | 5/2009 | Noda et al. |
| 7,592,021 | B2 | 9/2009 | Shankar et al. |
| 7,678,861 | B2 | 3/2010 | Moore et al. |
| 7,713,835 | B2* | 5/2010 | Pillalamarri .................. 438/455 |
| 8,092,628 | B2 | 1/2012 | Hong et al. |
| 8,236,669 | B2* | 8/2012 | Hong et al. .................. 438/458 |
| 2008/0200011 | A1 | 8/2008 | Pillalamarri et al. |
| 2009/0035590 | A1 | 2/2009 | Sullivan et al. |
| 2009/0038750 | A1 | 2/2009 | Hong et al. |
| 2009/0218560 | A1 | 9/2009 | Flaim et al. |
| 2010/0121014 | A1 | 5/2010 | Nakazawa |
| 2011/0069467 | A1* | 3/2011 | Flaim et al. .................. 361/807 |
| 2011/0308739 | A1 | 12/2011 | McCutcheon et al. |
| 2012/0034437 | A1 | 2/2012 | Puligadda et al. |
| 2014/0239453 | A1* | 8/2014 | Puligadda et al. ............ 257/618 |

OTHER PUBLICATIONS

S. Combe et al., "Reversible Wafer Bonding: Challenges in Ramping up 150mm GaAs Wafer Production to Meet Growing Demand," MANTECH 2006, pp. 193-196.

Y. Kwon et al., "An Evaluation Process of Polymeric Adhesive Wafer Bonding for Vertical System Integration," Japanese Journal of Applied Physics, Part 1, vol. 44, No. 6A, 2005, pp. 3893-3902.

F. Niklaus et al., "Adhesive Wafer Bonding," J. Appl. Phys., vol. 99, 2006, pp. 031101-1-031101-28.

Dow Chemical Company Product Information D.E.R. TM 332 Liquid Epoxy Resin, 3 pages.

* cited by examiner

Fig. 3 ial grain, and imp chains, small chip packages, and multiple chips in a package. However, the reduction in wafer thickness combined with an increasing wafer diameter produces the tendency for the wafer to warp and fold, and thus creates a demand for new methods of wafer handling. Bonding substrate wafers to carrier wafers is one way of supporting brittle substrates such as GaAs, GaN, SiC, and InP during wafer thinning and backside processing. Of the different wafer-level bonding techniques, temporary wafer bonding using polymeric adhesives, followed by solvent or mechanical debonding, is becoming increasingly important for both integrated circuit and MEMS packaging, mainly due to its low cost, ease of processing, and adaptability to different substrate and device types. However, most of the currently available adhesives do not have adequate thermal or mechanical stability to withstand the high temperatures encountered in backside processing steps such as metallization, or dielectric deposition and annealing.

DEVELOPMENT OF HIGH-VISCOSITY BONDING LAYER THROUGH IN-SITU POLYMER CHAIN EXTENSION

FEDERALLY SPONSORED RESEARCH OR DEVELOPMENT

Portions of this invention were made with government support under contract number FA8650-05-D-5806/0023 awarded by the Air Force Research Laboratory (AFRL). The United States Government has certain rights in the invention.

BACKGROUND OF THE INVENTION

1. Field of the Invention

The present invention is broadly concerned with temporary wafer bonding compositions and methods of using the same.

2. Description of the Prior Art

Wafer thinning has been effectively used to improve heat dissipation in power devices and to fabricate flexible substrates, small chip packages, and multiple chips in a package. However, the reduction in wafer thickness combined with an increasing wafer diameter produces the tendency for the wafer to warp and fold, and thus creates a demand for new methods of wafer handling. Bonding substrate wafers to carrier wafers is one way of supporting brittle substrates such as GaAs, GaN, SiC, and InP during wafer thinning and backside processing. Of the different wafer-level bonding techniques, temporary wafer bonding using polymeric adhesives, followed by solvent or mechanical debonding, is becoming increasingly important for both integrated circuit and MEMS packaging, mainly due to its low cost, ease of processing, and adaptability to different substrate and device types. However, most of the currently available adhesives do not have adequate thermal or mechanical stability to withstand the high temperatures encountered in backside processing steps such as metallization, or dielectric deposition and annealing.

The major limitations of conventionally used adhesives such as waxes and commercial tapes for temporary wafer bonding include limited thermal stability at high processing temperatures, poor planarity (which contributes excessive total thickness variation across the wafer dimensions), and poor chemical resistance. To address these problems, a number of thermally stable bonding materials have been developed. Examples of these materials include polyimides, cyclic olefin copolymer compositions, cellulose derivatives, and rubber dispersed hydrocarbon resins. These materials require excessively high bonding pressures or bonding temperatures to achieve sufficient melt flow for good bond formation to occur. Consequently, this results in mechanical weakness when wafer processing at high temperatures, and causes process failures due to reflow of the bonding material in the bonded state. Alternatively, other materials such as thermosets have been used to overcome the reflow problem of thermoplastic adhesives. However, although thermosets are mechanically strong, they require complicated mechanisms for debonding, such as, laser rastering to release the carrier followed by peeling the adhesive from the surface of the thinned processed wafer. This can potentially cause serious damage to the thinned wafer. In addition, the residue often left on the device wafer is difficult to remove and can cause issues in downstream processing and device reliability.

Thus, there remains a need for new modes of carrier-assisted thin wafer handling that provide high wafer throughput and reduce or eliminate the chances for device wafer breakage and internal device damage.

SUMMARY OF THE INVENTION

The present invention broadly provides a method of forming a temporary wafer bonding structure. The method comprises providing a first substrate having front and back surfaces, wherein the first substrate is a microelectronic substrate. A second substrate having front and back surfaces is also provided. A bonding composition is applied to the front surface of at least one of the first substrate and/or second substrate. The bonding composition comprises a plurality of components optionally dispersed or dissolved in a solvent system. The front surface of the other one of the first or second substrates is contacted with the bonding composition. The components in the bonding composition are then polymerized to yield a polymerized layer between the first and second substrates, thereby bonding the substrates and forming the temporary bonding structure.

A microelectronic structure is also provided. The structure comprises a first substrate having front and back surfaces, wherein the first substrate is a microelectronic substrate; a bonding composition adjacent the first substrate surface; and a second substrate adjacent the bonding composition. The bonding composition comprises a plurality of unreacted components optionally dispersed or dissolved in a solvent system, and is substantially free of polymeric compounds.

The invention is also concerned with a further method of forming a temporary wafer bonding structure. The method comprises providing a first substrate having front and back surfaces and applying a bonding composition to the front surface of the first substrate. The bonding composition comprises a plurality of components optionally dispersed or dissolved in a solvent system. A second substrate having front and back surfaces is provided and the front surface of the second substrate is contacted with the bonding composition on the first substrate. The components in bonding composition are then polymerized to yield a polymerized layer between the first and second substrates, thereby bonding the substrates. The back surface of the first substrate in the bonded wafer stack is then subjected to backside processing.

DETAILED DESCRIPTION OF THE INVENTION

In more detail, the present invention provides temporary wafer bonding compositions that are mechanically strong at high temperatures for robust wafer processing, but are able to bond at lower temperatures and remain removable/cleanable after debonding. In particular, the invention provides compositions comprising a plurality of components, optionally dispersed or dissolved in a solvent system. The components are selected from the group consisting of monomers, oligomers, and mixtures thereof. In one aspect, the monomers and oligomers for use in the composition comprise a terminally reactive compound and a chain extender. The term "terminally reactive compound," as used herein, includes terminally reactive monomers, oligomers, or mixtures thereof. The terminally reactive compound will preferably have a weight average molecular weight (Mw) of from about 200 to about 20,000 Daltons, more preferably from about 500 to about 10,000 Daltons, and even more preferably from about 700 to about 2,000 Daltons. Suitable terminally reactive compounds are preferably selected from the group consisting of diols, dicarboxylic acids, diamines, and diacrylates (i.e., any compounds endcapped with —OH, —COOH, —NH$_2$, or —OOCCH═CH$_2$ groups, respectively).

Suitable diols for use in the invention are those of the formula of HO—Y—OH, where Y is selected from the group consisting of alkylenes ($C_5$-$C_{200}$, and preferably $C_{10}$-$C_{100}$ alkylenes), cycloalkylenes ($C_6$-$C_{200}$, and preferably $C_6$-$C_{50}$ cycloalkylenes), and substituted and unsubstituted arylenes ($C_6$-$C_{200}$, and preferably $C_6$-$C_{50}$ arylenes). Substituted arylenes include those substituted by a halogen, or functional groups such as esters, ethers, amides, sulfones, sulfides, siloxanes, and the like. When present, the composition preferably comprises from about 25 to about 90% by weight diol, more preferably from about 30 to about 70% by weight diol, and even more preferably from about 40 to about 60% by weight diol, based upon the total weight of the solids in the composition taken as 100% by weight. Preferred diols for use in the invention include aliphatic and cyclic diols, bisphenols, and bifunctional polyols. Examples of aliphatic dials include ethylene glycol, propylene glycol, 1,3-propanediol, 1,4-butanediol, 1,5-pentanediol, 1,6-hexanediol, 1,7-heptanediol, 1,2-propanediol, 1,3-butanediol, 2,3-butanediol, 3-methylpentane-1,5-diol, 2-methyloctane-1,8-diol, and 1,4-cyclohexanedimethanol. Examples of cyclic diols include 1,3-cyclobutanediol and others as disclosed in U.S. Pat. No. 5,563,193 (e.g., 1,3-cyclobutanediol, 1,3-cyclopentanediol, 1,2-cyclohexanediol, 1,3-cyclohexanediol, 1,4-cyclohexanediol, 2-cyhclohexene-1,4-diol, 2-methyl-1,4-cyclohexanediol, 2-ethyl-1,4-cyclohexanediol, 1,3-cyclo-heptanediol, 1,4-cycloheptanediol, 2-methyl-1,4-cycloheptanediol, 4-methyl-1,3-cycloheptanediol, 1,3-cyclooctanediol, 1,4-cyclooctanediol, 1,5-cyclooctanediol, 5-methyl-1,4-cyclooctanediol, 5-ethyl-1,4-cyclooctanediol, 5-propyle-1,4-cyclooctanediol, 5-butyl-1,4-cyclooctanediol, 5-hexyl-1,4-cyclooctanediol, 5-heptyle-1,4-cyclooctanediol, 5-octyl-1,4-cyclooctanediol, 4,4'-methylene-bis(cyclohexdnol), 4,4'-methylenebis(2-methylcyclohexanol), 4,4'-methylenebis(3-methylcyclohexanol), 3,3'-methylenebis(cyclohexanol), 4,4'-ethylenebis(cyclohexanol), 4,4'-propylene-bis(cyclohexanol), 4,4'-butylenebis(cyclohexanol), 4,4'-isobutylenebis(cyclohexanol), 4,4'-dihydroxydicyclohexyl, 4,4'-carbonylbis(cyclohexanol), 3,3'-carbonylbis(cyclohexanol), and 4,4'-sulfonylbis(cyclohexanol), 4,4'-oxybis(cyclohexanol)). Examples of bisphenols include bisphenol A (4,4'-isopropylidene diphenol), bisphenol P (α,α'-bis(4-hydroxyphenyl)-1,4-diisopropylbenzene), bisphenol M (4,4'-(1,3-phenylenediisopropylidene)bisphenol), 4,4'-dihydroxydiphenyl-ethylmethane, 3,3'-dihydroxydiphenyldiethylmethane, 3,4'-dihydroxydiphenylmethylpropylmethane, 4,4'-dihydroxydiphenyloxide, 4,4'-dihydroxybenzophenone, 4,4'-dihydroxydiphenyl sulfide, bisphenol S (4,4'-dihydroxydiphenylsulfone), 2,6-di-hydroxynaonthalene, and 9,9-bis(4-hydroxyphenyl)fluorene. Examples of bifunctional polyols include polyethylene glycol, poly(ethylene glycol)-block-polypropylene glycol)-block-poly(ethylene glycol), poly(ethylene glycol-ran-propylene glycol), polybutylene glycol, polytetrahydrofurane, polycaprolactone, ethyleneglycol-opolyadipate, 1,4-butanediol-polyadipate, 1,6-hexanediol-polyadipate, 1,6-hexanediol-polysuccinate, 1,6-hexanediol-polycarbonate, and tetraethyleneglycol polycarbonate. Mixtures of the foregoing diols may also be used.

Suitable dicarboxylic acids are those of the formula of HOOC—Y—COOH, where Y is selected from the group consisting of alkylenes ($C_5$-$C_{200}$, and preferably $C_{10}$-$C_{100}$ alkylenes), cycloalkylenes ($C_6$-$C_{200}$, and preferably $C_6$-$C_{50}$ cycloalkylenes), and substituted and unsubstituted arylenes ($C_6$-$C_{200}$, and preferably $C_6$-$C_{50}$ arylenes). Substituted arylenes include those substituted by a halogen, or functional groups such as esters, ethers, amides, sulfones, sulfides, siloxanes, and the like. When present, the composition preferably comprises from about 25 to about 90% by weight dicarboxylic acid, more preferably from about 30 to about 80% by weight dicarboxylic acid, and even more preferably from about 35 to about 50% by weight dicarboxylic acid, based upon the total weight of the solids in the composition taken as 100% by weight. Preferred dicarboxylic acids for use in the invention include adipic acid, 2,2-dimethylglutaric acid, trimethyl adipic acid, dodecanedioic acid, 1,3-cyclobutanedicarboxylic acid, 1,3-cyclohexanedicarboxylic acid, terephthalic acid, isophthalic acid, 4,4'-diphenyldicarboxylic acid, 4,4'-diphenylsulfonecarboxylic acid, or 4,4'-diphenyl ether dicarboxylic acid. Mixtures of the foregoing dicarboxylic acids may also be used.

Suitable diamines are those of the formula of H$_2$N—Y—NH$_2$, where Y is selected from the group consisting of alkylenes ($C_5$-$C_{200}$, and preferably $C_{10}$-$C_{100}$ alkylenes), cycloalkylenes ($C_6$-$C_{200}$, and preferably $C_6$-$C_{50}$ cycloalkylenes), and substituted and unsubstituted arylenes ($C_6$-$C_{100}$, and preferably $C_6$-$C_{50}$ arylenes). Substituted arylenes include those substituted by a halogen, or functional groups such as esters, ethers, amides, sulfones, sulfides, siloxanes, and the like. When present, the composition preferably comprises from about 25 to about 90% by weight diamine, more preferably from about 30 to about 70% by weight diamine, and even more preferably from about 45 to about 55% by weight diamine, based upon the total weight of the solids in the composition taken as 100% by weight. Preferred diamines for use in the invention include 4,4'-(9-fluorenylidene)dianiline, bis[4-(3-aminophenoxy)phenyl]sulfone, polyoxyethylene bis(amine), 1,4-diaminobutane, 1,5-diamino-2-methylpentane, 1,2-diaminocyclohexane, 1,3-cyclohexanebis(methylamine), 4,4'-methylenebis(cyclohexylamine), p-phenylene diamine, 1,3'-bis(3-aminophenoxy)benzene, 4-aminophenyl sulfone, 2,2-bis[4-(4-aminophenoxy)phenyl]propane, diaminodiphenyl ether, or 1,3-bis(3-aminopropyl)tetramethyl disiloxane. Mixtures of the foregoing diamines can also be used.

Suitable diacrylates are those of the formula of H$_2$C═HCCOO—Y—OOCCH═CH$_2$, where Y is selected from the group consisting of alkylenes ($C_5$-$C_{200}$, and preferably $C_{10}$-$C_{100}$ alkylenes), cycloalkylenes ($C_6$-$C_{100}$, and preferably $C_6$-$C_{50}$ cycloalkylenes), and substituted and unsubstituted arylenes ($C_6$-$C_{200}$, and preferably $C_6$-$C_{50}$ arylenes). Substituted arylenes include those substituted by a halogen, or functional groups such as esters, ethers, amides, sulfones, sulfides, siloxanes, and the like. When present, the composition preferably comprises from about 25 to about 90% by weight diacrylate, more preferably from about 50 to about 80% by weight diacrylate, and even more preferably from about 60 to about 75% by weight diacrylate, based upon the total weight of the solids in the composition taken as 100% by weight. Preferred diacrylates for use in the invention include bisphenol A epoxy resin diacrylate ester, aliphatic urethane diacrylate, hexanediol glycol diacrylate, propoxylated glycerol diacrylate, or neopentyl glycol diacrylate. Mixtures of the foregoing diacrylates can also be used.

The term "chain extender," as used herein, refers to difunctional, low molecular weight (Mw<20,000 Daltons) species that can be reacted with the terminally reactive compound to produce a chain-extending, linear reaction (i.e., polymerization, as that term is used herein). The term excludes crosslinking agents, which are considered herein to be multi-functional (i.e., tri-functional or greater) species that produce a branching reaction and/or crosslinking of the polymer. Such branching and crosslinking or curing is undesirable in the present invention and preferably avoided. Suitable chain extenders will preferably have a weight average molecular weight of from about 200 to about 20,000 Daltons, more preferably from about 200 to about 10,000 Daltons, and even more preferably from about 200 to about 1,000 Daltons. Preferably, the chain extenders are selected from the group consisting of diisocyanates, diglycidyl ethers, bisoxazolines, biscaprolactums, dithiols, and compounds endcapped by isocyanate, epoxy, oxazoline, caprolactam, or thiol groups.

Suitable diisocyanates include aliphatic ($C_5$-$C_{200}$, and preferably $C_{10}$-$C_{100}$), cycloaliphatic ($C_6$-$C_{200}$, and preferably $C_6$-$C_{50}$), araliphatic ($C_6$-$C_{200}$, and preferably $C_6$-$C_{50}$) and aromatic isocyanates, as well as compounds endcapped by isocyanate groups:

OCN—R—NCO, where R is selected from the group consisting of aliphatic, cycloaliphatic, and aromatic moieties. When present, the composition preferably comprises from about 9 to about 75% by weight diisocyanate, more preferably from about 30 to about 60% by weight diisocyanate, and even more preferably from about 45 to about 55% by weight diisocyanate, based upon the total weight of the solids in the composition taken as 100% by weight. Examples of suitable diisocyanates include 1,4-tetra-methylenediisocyanate, 1,6-hexamethylenediisocyanate, 1,12-dodecanediisocyanate, cyclohexane-1,3-diisocyanate, cyclohexane-1,4-diisocyanate, 1-isocyanato-3,3,5-trimethyl-5-isocyanato-methyl-cyclohexane, 1,3- and 1,4-phenylenediisocyanate, 2,4- and 2,6-toluenediisocyanante (TDI), 4,4'-methylenebis(phenyl isocyanate) (MDI), isophorone diisocyanate, naphthylene-1,5-diisocyanate, m-xylylenediisocyanate, trimethylhexamethylenediisocyanate, poly(propylene glycol), or tolylene 2,4-diisocyanate terminated. Mixtures of the foregoing diisocyanates can also be used.

Suitable diglycidyl ethers will have the general formula:

where R is selected from the group consisting of aliphatic, cycloaliphatic, and aromatic moieties. When present, the composition preferably comprises from about 25 to about 90% by weight diglycidyl ether, more preferably from about 30 to about 70% by weight diglycidyl ether, and even more preferably from about 40 to about 60% by weight diglycidyl ether, based upon the total weight of the solids in the composition taken as 100% by weight. Exemplary diglycidyl ethers include resorcinol diglycidyl ether, 9,9-bis(4-hydroxyphenyl)fluorene, 3,3-bis(4-hydroxyphenyl)phthalide, 3,3-bis(4-hydroxyphenyl)oxoisoindole, or diglycidyl ethers of bisphenol A (e.g., Dow® DER 332) and its higher homologs that contain more than one [—O—Ar—C(CH3)2-Ar—O—] repeating unit between the terminal glycidyl groups. Mixtures of the foregoing diglycidyl ethers may also be used.

Suitable bisoxazolines will have the general formula:

where R is selected from the group consisting of aliphatic, cycloaliphatic, and aromatic moieties, and each R' is individually selected from the group consisting of —H and hydrocarbon (allylic or aromatic) side chains and excludes halogens. When present, the composition preferably comprises from about 5 to about 75% by weight bisoxazoline, more preferably from about 20 to about 70% by weight bisoxazoline, and even more preferably from about 40 to about 60% by weight bisoxazoline, based upon the total weight of the solids in the composition taken as 100% by weight. Exemplary bisoxazolines include 2,2'-methylenebis(2-oxazoline), 2,2'-ethylenebis(2-oxazoline), 4,4',5,5'-tetrahydro-2,2'-bisoxazole, 2,2'-(1,3-phenylene)bis(2-oxazoline), 2,2'-tetramethylenebis(2-oxazoline), 2,2'-ethylenebis(4-methyl-2-oxazoline), 2,2'-(1,4-phenylene)bis(2-oxazoline), 2,2'-p-phenylenebis(4-phenyl-2-oxazoline), 1,2-bis(2-oxazolinyl-2)ethane, 1,4-bis(2-oxazolinyl-2)butane, 1,4-bis(2-oxazolinyl-2)cyclohexane, 1,2-bis(2-oxazolinyl-2)benzene, 1,4-bis(5-methyl-2-oxazolinyl-2)benzene, 2,2'-(alkanediyl) bis(4,5-dihydrooxazole), 2,2'-(arylene)bis(4,5-dihydrooxazole), a sulfonyl, oxy, thio or alkylene bis 2-(arylene) (4,5-dihydrooxazole), 2,6-bis[(4R)-4-phenyl-2-oxazolinyl] pyridine, 2,2'-isopropylidenebis[(4S)-4-tert-butyl-2-oxazoline], (−)-2,2'Isopropylidenebis[(4S)-4-phenyl-2-oxazoline], (+)-2,2'-Isopropylidenebis-[(4R)-4-benzyl-2-oxazoline], 2,2'-Methylenebis[(4R,5S)-4,5-diphenyl-2-oxazoline], and the like. Mixtures of the foregoing bisoxazolines may also be used.

Suitable biscaprolactams will have the general formula:

where R is selected from the group consisting of aliphatic, cycloaliphatic, and aromatic moieties, each $R^1$ is individually selected from the group consisting of —H and hydrocarbon (allylic or aromatic) side chains and excludes halogens. When present, the composition preferably comprises from about 25 to about 75% by weight biscaprolactam, more preferably from about 35 to about 65% by weight biscaprolactam, and even more preferably from about 45 to about 55% by weight biscaprolactam, based upon the total weight of the solids in the composition taken as 100% by weight. Exemplary biscaprolactams include terephthaloyl biscaprolactam, adipoyl biscaprolactam, isophthaloyl biscaprolactam, cyclohexanedicarbonyl biscaprolactam, and the like as disclosed in U.S. Pat. No. 4,031,164 (incorporated by reference herein), and N,N'-carbonyl biscaprolactam, carbonyl bis-valerolactam, carbonyl bis-pyrrolidinone, chlorophosphoryl biscaprolactam, and the like as disclosed in U.S. Pat. No. 3,862,262

(incorporated by reference herein). Mixtures of the foregoing biscaprolactams may also be used.

Suitable dithiols will have the general formula HS—R—SH, where R is selected from the group consisting of aliphatic, cycloaliphatic, and aromatic moieties. When present, the composition preferably comprises from about 10 to about 75% by weight dithiol, more preferably from about 20 to about 50% by weight dithiol, and even more preferably from about 25 to about 40% by weight dithiol, based upon the total weight of the solids in the composition taken as 100% by weight. Exemplary dithiols include ethylene bis 3-mercaptopropionate, glycol dimercaptoacetate, poly(ethylene glycol) dithiol, or biphenyl-4-4'-dithiol. Mixtures of the foregoing dithiols may also be used.

In a further embodiment of the invention, the terminally reactive compound and chain extender are respectively selected from the group consisting of dithiols, diacrylates, and mixtures thereof. Preferably, the composition in this embodiment comprises equal molar proportions of dithiol and diacrylate. It will be appreciated that either compound can serve as either the terminally reactive compound or chain extender, depending upon the amount used. Preferably, the chain extender comprises dithiol, while the terminally reactive compound comprises diacrylate, as described above.

Regardless of the embodiment, the compositions can optionally comprise a solvent system in which the components are dispersed or dissolved. The level of the solvent system can be varied depending upon the desired thickness of the bonding composition. When present, the composition preferably comprises from about 50 to about 95% by weight solvent system, more preferably from about 60 to about 85% by weight solvent system, and even more preferably from about 75 to about 80% by weight solvent system, based upon the total weight of the composition taken as 100% by weight. Suitable solvents for use in the solvent system are selected from the group consisting of alkenes (e.g., 1-dodecene, 1-octene), cycloalkenes (e.g., cyclooctene), ketones (e.g., acetone, cyclopentanone), and mixtures thereof. As also noted above, the use of a solvent is optional in the invention. Thus, in some embodiments, the composition will be substantially free of solvents, including those listed above. As used herein, the phrase "substantially free," unless otherwise defined, means that the ingredient is present in the composition at a level of less than about 0.5% by weight, more preferably less than about 0.1% by weight, and even more preferably about 0% by weight, based upon the total weight of the composition taken as 100% by weight.

The compositions can also comprise additives including catalysts or initiators, antioxidants, surfactants, and/or rheology modifiers. Various thermal or photoinitiated catalysts can be used depending upon the desired chain extension reaction and components of the composition. For example, dicumyl peroxide or benzoyl peroxide can be used as thermal initiators. Likewise, IRGACURE® 819, 369, 379, and DAROCUR® liquid 1173 can be used as photoinitiators. Particularly preferred catalysts for polymerization of a composition comprising diol and diisocyanate include organometallic compounds such as organotin compounds, e.g., stannous octylate, dibutyltin diacetate, dibutyltin dilaurate, and tertiary amines, e.g., N-methyl-morpholine, triethylamine, trioctylamine. Particularly preferred catalysts for polymerization of a composition comprising diol and diglycidyl ether include quaternary ammonium and phosphonium salts, such as tetraethylammonium bromide and ethyltriphenylphosphonium acetate. Particularly preferred catalysts for polymerization of a composition comprising dithiol and diacrylate include bis(2,4,6-trimethylbenzoyl)-phenylphosphineoxide, and dicumyl peroxide. When present, the composition preferably comprises from about 0.5 to about 10% by weight catalyst, more preferably from about 0.75 to about 7% by weight catalyst, and even more preferably from about 1.0 to about 4% by weight catalyst, based upon the total weight of the solids, taken as 100% by weight. In some embodiments, the composition is substantially free of any catalyst. As noted above, crosslinking/curing is preferably avoided in the present invention. Thus, the composition is also preferably substantially free of crosslinking agents (e.g., melamines).

The inventive compositions are formed by simply mixing the components and any other ingredients with the solvent system (when present), preferably at room temperature (~23° C.) to about 80° C., for time periods of from about 1-72 hours. Importantly, the components do not react in the composition, and more specifically do not undergo polymerization in the composition. Thus, the composition comprises at least about 50% by weight unreacted components, more preferably at least about 75% by weight unreacted components, and even more preferably at least about 95% by weight unreacted components, based upon the total solids in the composition taken as 100% by weight. The term "unreacted components" is used herein to refer to the monomers and oligomers in their initial states prior to polymerization or chain extension (i.e., monomers and oligomers having a weight average molecular weight of less than about 10,000 Daltons or less than about 10 monomeric repeat units). Preferably, the total weight of unreacted components is substantially equal to the total weight of all components added to the composition before polymerization and chain extension is initiated. In other words, no reactions have taken place within the composition at this stage in the process. Thus, in some embodiments, at least about 50% by weight of the solids in the composition are non-polymeric, preferably at least about 75% by weight, and more preferably at least about 80% by weight of the solids in the composition are non-polymeric compounds based upon the total weight of the solids in the composition taken as 100% by weight. Prior to polymerization and chain extension, the composition preferably comprises less than about 50% by weight polymeric compounds, more preferably less than about 20% by weight polymeric compounds, and even more preferably is substantially free of polymeric compounds (i.e., less than about 5% by weight polymeric compounds) based upon the total weight of the solids taken as 100% by weight. The term in "non-polymeric" is defined herein to refer to compounds having a weight average molecular weight of less than about 10,000 Daltons or compounds having less than about 10 monomeric repeat units. In other words, it will be appreciated that some monomeric or oligomeric compounds or molecules may have large molecular weights above 10,000 Daltons, but are nonetheless non-polymeric as having less than about 10 monomeric repeat units. The term "polymeric" is defined herein to refer to compounds having more than 10 monomeric repeat units that do not otherwise fit the definition of non-polymeric set forth herein.

The Brookfield viscosity of the final composition will preferably be less than about 100,000 cP, more preferably less than about 50,000 cP, and even more preferably from about 1,000 cP to about 10,000 cP; however, it will be appreciated that the viscosity will vary slightly depending upon the amount of solvent used. For purposes of these measurements, the Brookfield viscosity is determined using Brookfield Synchro-Lectric Viscometer (Model LVT) with a small sample adapter spindle SC4-18 (sample volume=6.7 mL) in a SC4-13R sample chamber. The viscosity of the tested fluids is preferably measured over a range of shear rates (0.3-60 $s^{-1}$) at a temperature of 38° C. A circulating water bath (PolyScience Heating Recirculator, Model 210) can be used to maintain a constant temperature. The measurement indicates the shear stress on the spindle imparted by the sample as the spindle rotates a constant speed in the sample. The shear stress is presented as degree of spindle lag on a rotating dial. This reading is automatically converted to a viscosity in centipoise by a factor based on spindle size and rotational speed, using a ViscoCal program.

In use, the temporary wafer bonding composition can be applied to either the carrier substrate or active (device) wafer, although it is preferred that it be applied to the active wafer first. It will be appreciated that the composition can be applied directly to the substrate or to optional intermediate layers on the substrate surface. A preferred application method involves spin-coating the composition at spin speeds of from about 500-5,000 rpm (more preferably from about 1,000-3,500 rpm), at accelerations of from about 3,000-10,000 rpm/second, and for spin times of from about 30-180 seconds (preferably about 30-60 seconds). The composition can also be applied by spin-casting, which comprises applying a quantity of the composition to the substrate surface, followed by spinning the substrate at spin speeds of from about 500-5,000 rpm (more preferably from about 1,000-3,500 rpm), at accelerations of from about 3,000-10,000 rpm/second, and for spin times of from about 30-180 seconds (preferably about 30-60 seconds). In some embodiments, the substrate can be heated during casting to facilitate the coating process. It will be appreciated that the application steps can be varied to achieve a particular desired coating thickness.

After coating, the substrate can be baked (e.g., on a hot plate) to evaporate the solvents, if present, and allow the bonding composition to reflow. Typical baking would be at temperatures of from about 50-200° C., and preferably from about 60-120° C., for a time period of from about 1-60 minutes, and more preferably from about 2-4 minutes.

After baking, a second substrate (e.g., the desired carrier or device wafer, depending upon which substrate the composition is first applied to) is contacted with, and pressed against, the layer of inventive bonding composition, preferably under vacuum (0.01-0.1 psi), and at a low temperature (<150° C., and preferably from about 30 to about 150° C.). The carrier substrate and active wafer are then bonded by initiating in situ chain extension (i.e., polymerization) of the terminally reactive compound and chain extender in the bonding composition to form the polymerized bonding layer. The term polymerization as used herein refers to chain extension (preferably linearly) and excludes crosslinking (i.e., curing). Polymerization can be initiated by heating the composition to the reaction temperature of the components in the bonding composition (preferably less than about 200° C.) for time periods of about 10 min. to about 24 hr, preferably from about 30 min. to about 10 hr, and more preferably from about 1 hr to about 4 hr. For example, a thermoplastic polyurethane bonding layer is obtained from a bonding composition comprising diol and diisocyanate compounds reacted at about 80-120° C. (preferably about 95-105° C.) in the presence of a catalyst. A poly(hydroxyether) bonding layer is obtained from a bonding composition comprising diol and diglycidyl ether compounds reacted at about 120-180° C. (preferably about 140-160° C.) in the presence of a catalyst. A polyesteramide bonding layer is obtained from a bonding composition comprising bisoxazoline and dicarboxylic acid compounds reacted at about 150-250° C. (preferably about 160-200° C.) without a catalyst. A thermoplastic polyurea bonding layer is obtained from a bonding composition comprising biscaprolactam and diamine compounds reacted at about 150-250° C. (preferably about 160-200° C.) for about 1 to about 4 hours without a catalyst. Polymerization is preferably carried out under vacuum (e.g., about 0.001-1 psi, and preferably about 0.01-0.1 psi). It will also be appreciated that other methods may be used to initiate polymerization besides heat, such as ultraviolet light, in the case of transparent substrates, or similar radiation to which the substrates are transparent.

Regardless of the embodiment, the molecular weight and mechanical strength of the bonding composition are increased upon in situ chain extension and polymer formation to yield the bonding layer. In particular, the polymerized bonding layer will comprise a plurality of reacted components having an increased weight average molecular weight as compared to the weight average molecular weight of the starting components of the bonding composition. Preferably, these reacted or polymerized components will comprise (consist essentially or even consist of) linear polymers. Thus, the bonding layer comprises at least about 50% by weight polymeric compounds, more preferably at least about 75% by weight polymeric compounds, and even more preferably at least about 95% by weight polymeric compounds, based upon the total solids in the polymerized bonding layer taken as 100% by weight. The components are preferably essentially free of any branching or crosslinking. In other words at least about 50% by weight, preferably at least about 75% by weight, and more preferably at least about 95% by weight of the resulting polymers are non-crosslinked polymers, based upon the total weight of the polymers taken as 100% by weight.

Figure 1:
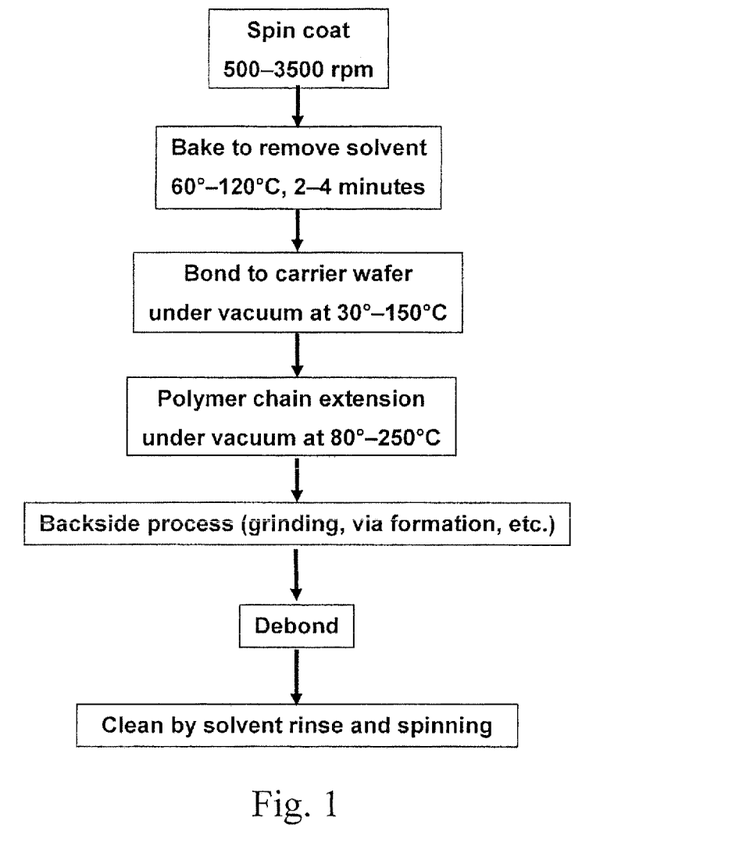
FIG. 1 is a flow diagram showing exemplary process steps carried out in the inventive methods.

The bonding layer will also have a Brookfield viscosity that is increased as compared to the viscosity of the bonding composition. The Brookfield viscosity of the bonding layer will preferably be at least about 2 times greater than the viscosity of the bonding composition prior to polymerization, more preferably at least about 3 times greater, and even more preferably at least about 5 times greater. Preferably, the Brookfield viscosity of the bonding layer is at least about 50,000 cP, more preferably at least about 500,000 cP, and even more preferably from about 150,000 cP to about 250,000 cP. It will be appreciated by those in the art that the viscosity can be measured using a Wells-Brookfield Cone/Plate Viscometer at 38° C. The bonding layer will also preferably be thermally stable at high temperatures. That is, the bond integrity can be maintained even during exposure to temperatures greater than about 250° C. The bonded wafer stack can then be subjected to backgrinding, metallization, patterning, passivation, via forming, and/or other processing steps involved in wafer thinning, followed by debonding. FIG. 1 outlines a typical process scheme for temporary wafer bonding using the inventive bonding compositions.

Figure 2:
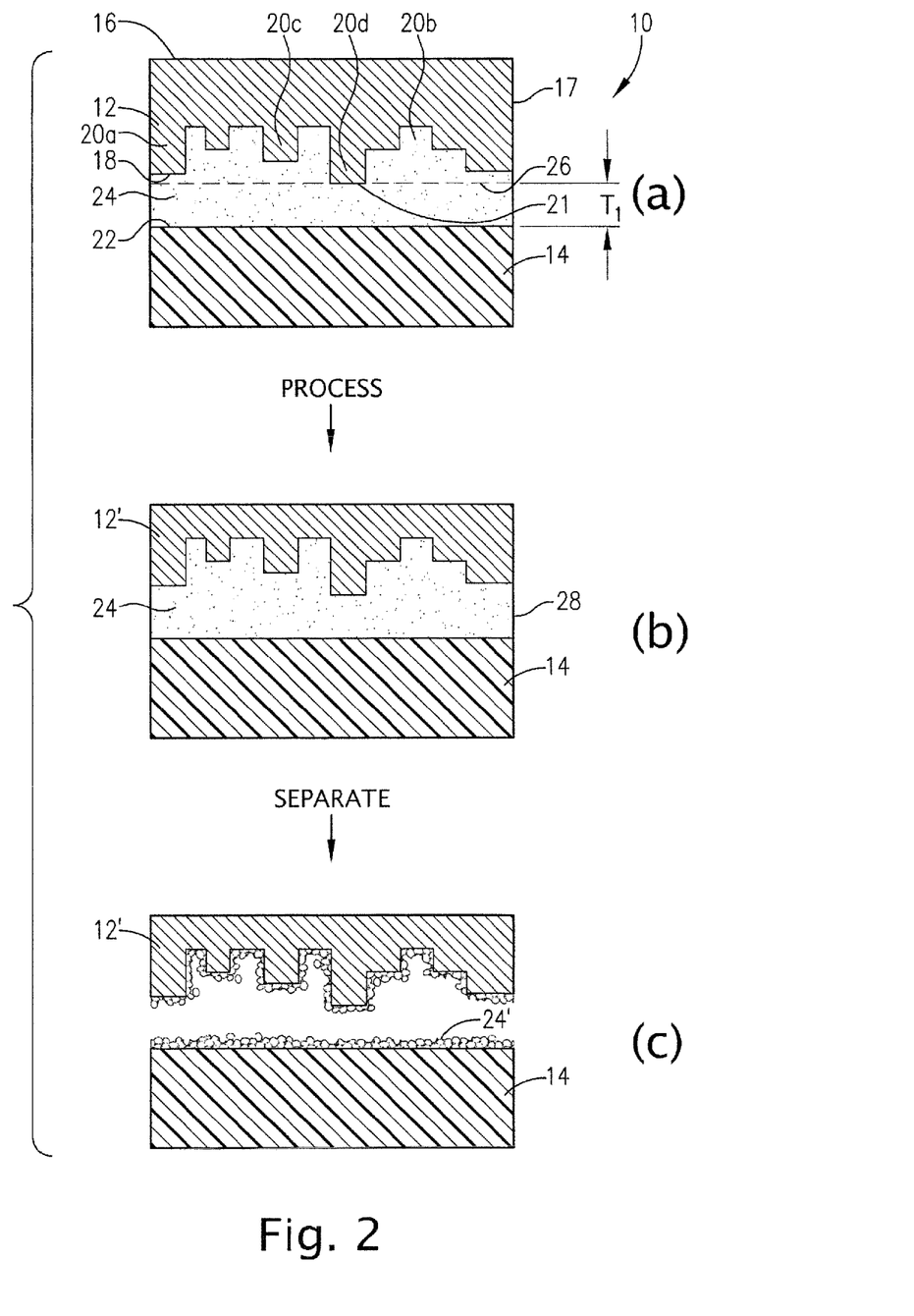
FIG. 2 is a schematic cross-section of a bonded and debonded wafer stack according to one aspect of the present invention.

FIG. 2(a) illustrates an exemplary stack 10 comprising an active wafer or substrate 12 and a carrier wafer or substrate 14. It will be appreciated that stack 10 is not shown to scale and has been exaggerated for the purposes of this illustration. Active wafer 12 has a back surface 16, an outermost edge 17 defining the periphery (perimeter) of the substrate 12, and a front or active surface 18. Typical active wafers 12 can include any microelectronic substrate. Examples of some possible active wafers 12 include those whose surfaces comprise arrays of devices selected from the group consisting of integrated circuits, microelectromechanical system (MEMS), display devices, compound semiconductors, microsensors, power semiconductors, light-emitting diodes, photonic circuits, interposers, embedded passive devices, as well as flexible substrates (e.g., cured epoxy substrates, roll-up substrates that can be used to form maps), low k dielectric layers, dielectric layers (e.g., silicon oxide, silicon nitride), ion implant layers, and substrates comprising silicon, aluminum, tungsten, tungsten silicide, gallium arsenide, germanium, tantalum, tantalum nitrite, SiGe, and mixtures of the foregoing. The surfaces of these devices also commonly comprise structures formed from one or more of the following materials: silicon, polysilicon, silicon dioxide, silicon (oxy) nitride, metals (e.g., copper, aluminum, gold, tungsten, tantalum), low-k dielectrics, polymer dielectrics, and various metal nitrides and silicides. The active surface 18 can also include raised structures such as solder bumps and metal posts and pillars. As shown in FIG. 2(a), active surface 18 can comprise various topographical features 20a-20d due to the presence of the above-described devices as well as of raised features, contact holes, via holes, lines, trenches, etc., that are present on or in active surface 18. As used herein, "topography" refers to the height or depth of a structure in or on a substrate surface, where feature 20d represents the "highest" feature on active surface 18. That is, the end portion or surface 21 for feature 20d is further from back surface 16 of wafer 12 than the respective end portions of any other topographical feature on wafer 12. It will be appreciated that, because the bonding composition can be applied to active surface 18 by spin-coating or spray-coating, the bonding composition preferably flows into and over the various topographical features before polymerization.

Carrier substrate 14 has a bonding surface 22. Typical carrier substrates 14 comprise a material selected from the group consisting of sapphire, ceramic, glass, quartz, aluminum, silver, silicon, glass-ceramic composites (such as products sold under the name Zerodur®, available from Schott AG), and combinations thereof.

Wafer 12 and carrier substrate 14 are bonded together via bonding layer 24. Bonding layer 24 is formed from the inventive polymerized compositions, as described above. As shown in FIG. 2(a), polymerized bonding layer 24 is bonded to active surface 18 of wafer 12 as well as to bonding surface 22 of substrate 14, and forms a uniform layer over the topography of active surface 18. To illustrate this point, FIG. 2(a) shows a plane designated by dashed line 26, at end portion 21 and substantially parallel to back surface 16. The distance from this plane to bonding surface 22 is represented by the thickness "$T_1$." The thickness "$T_1$" will vary by less than about 20%, preferably by less than about 10%, more preferably by less than about 5%, even more preferably by less than about 2%, and most preferably less than about 1% across the length of plane 26 and substrate 14.

Figure 3:
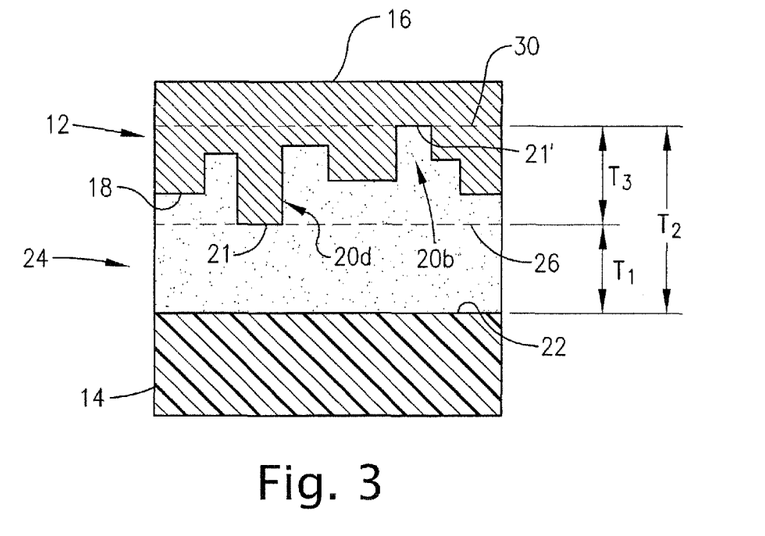
FIG. 3 is an enlarged schematic cross-section of a bonded wafer stack showing the various thicknesses used to characterize the inventive bonding layer.

The thickness of bonding layer 24 is further illustrated in FIG. 3, where like numbering has been used to represent like parts. As shown in FIG. 3, feature 20d represents the "highest" feature on active surface 18, whereas 20b represents the "lowest" feature whose lowest point is closest to back surface 16 of first substrate 12. Feature 20b has a lowermost surface or point 21'. In addition to $T_1$, the thickness "$T_2$" of the bonding layer 24 can also be characterized in terms of the distance from a lower plane designated by dashed line 30, defined by lowermost surface or point 21' and extending to bonding surface 22, as exemplified in FIG. 3. Finally, in some instances, thickness $T_3$ is used, and it refers to the distance from upper plane 26 to lower plane 30. All thicknesses refer to average thicknesses taken over five measurements.

Bonding layer 24 preferably has a thickness $T_1$ of at least about 5 μm, more preferably from about 5 μm to about 50 μm, and even more preferably from about 10 μm to about 30 μm. In one or more embodiments of the invention bonding layer 24 preferably has a thickness $T_2$ that is at least equal to $T_3$, preferably from about $1.1T_3$ to about $1.5T_3$, and more preferably from about $1.2T_3$ to about $1.3T_3$. This will typically result in a thickness $T_2$ of at least about 24 μm, more preferably from about 45 μm to about 200 μm, and even more preferably from about 50 μm to about 150 μm.

Advantageously, bonding layer 24 is formed in situ, which means that the bonding composition is polymerized after the active wafer 12 and carrier wafer 14 are initially brought together, such that the two substrates 12, 14 are not actually bonded (or held together) until polymerization of the bonding composition to form bonding layer 24. Preferably, bonding layer 24 is a uniform (chemically the same) material across its thickness, such that the entire polymerized bonding layer 24 is formed of the same composition.

In some embodiments of the invention, the active surface 18 and/or bonding surface 22 can be pre-treated or subjected to surface modification before being contacted with the bonding composition to facilitate release of the substrates 12, 14, during debonding. Pre-treatment or surface modification can be used to alter the bonding strength interface between the bonding layer 24 and the treated surface. That is, it forms a non-stick or low adhesive strength interface between the treated substrate surface 18 or 22 and bonding layer 24. Pre-treatment or surface modification may be carried out over the entire surface area of the treated substrate surface, or it may only be applied to a portion of the treated substrate surface (such as only a central portion). When only a portion of the surface is to be pre-treated, a mask can be used to cover areas of the surface that are not to be treated. Such masks can be formed of photoresists, anti-reflective coatings, or any other conventional coatings used in microelectronic fabrication that can be easily removed from the substrate surface after surface modification, without disrupting the treated surface. Suitable surface modification may include, for example, chemical treatment of the substrate surface with a hydrophobic solution capable of reacting with the substrate surface to reduce its surface free energy. More preferably, hydrophobic organosilane solutions are used. Particularly preferred surface modifying compositions are selected from the group consisting of (fluoro)alkyl silane (e.g., perfluoroalkyltrichlorosilane), (fluoro)alkyl phosphonate, isocyanate silane, acrylate silane, and combinations thereof. The surface modifying composition can be applied by any suitable method, such as by spin coating at a speed of at least about 1,000 rpm for about 100 seconds (and preferably about 2,000 rpm for about 60 seconds). Thus, the surface modifying composition can be diluted with a solvent, such as FLUORINERT® (3M Corp.), prior to applying to the substrate surface. The substrate can then be baked to evaporate the solvent at about 50° C. to about 150° C. for about 30 seconds to about 5 minutes (and preferably at about 100° C. for about 1 minute). The substrate can then be rinsed with additional solvent and baked again to evaporate the solvent and remove unreacted surface modification solution.

Referring back to FIG. 2(a), in one or more embodiments, the bonding layer 24 can be formed directly adjacent active surface 18 (i.e., without any intermediate layers between the bonding layer 24 and substrate 12) and/or bonding surface 22 (i.e., without any intermediate layers between the bonding layer 24 and substrate 14). Alternatively, the bonding layer 24 can be formed adjacent one or more optional intermediate layers that are adjacent active surface 18 and/or bonding surface 22 (not shown). Thus, it will be appreciated that stack 10 could comprise a plurality of layers between active substrate 12 and carrier substrate 14 (i.e., one or more layers in addition to bonding layer 24). Such additional layers could be located on either side of the bonding layer 24 (i.e., between bonding layer 24 and substrate 12 and/or between bonding layer 24 and substrate 14) and can include, without limitation, additional bonding layers, adhesion promoting layers, fill layers and such.

Regardless of the embodiment, the bonded wafer stack 10 can then be subjected to subsequent thinning (or other backside processing) of the substrate as shown in FIG. 2(b), where 12' indicates the wafer 12 after thinning. It will be appreciated that the substrate can be thinned to thicknesses of less than about 100 μm, preferably less than about 50 μm, and more preferably less than about 25 μm. After thinning, typical backside processing, including backgrinding, patterning (e.g., photolithography, via etching), passivation, and metallization, and combinations thereof, may be performed.

After the desired processing has occurred, the thinned active wafer or substrate 12' can be separated from the carrier substrate 14 as depicted in FIG. 2(*c*). Advantageously, the inventive bonding compositions are particularly suited for separation at room temperature (i.e., without heating to first soften the bonding layer) using a low mechanical force (e.g., finger pressure, gentle wedging). In particular, separation can be accomplished by simply applying force to lift, peel, or slide one of wafer 12 or substrate 14 in a direction that is generally away from the other of wafer 12 or substrate 14 while maintaining the other in a substantially stationary position so as to resist the lifting or shearing force (e.g., by applying simultaneous opposing forces to wafer 12 and substrate 14). In some embodiments, a solvent can be used to partially dissolve a portion of the bonding layer 24 before applying pressure to separate the substrates, as described in more detail below, and/or a wedge razor can be inserted between the bonding layer 24 and substrate to cut the edge before separation. Tools and implements can also be used to facilitate separation, such as clamps, vacuum chucks, flexible chucks, adhesive film-covered chucks, and the like, which are known in the art.

In an alternative embodiment, the active wafer 12 and carrier substrate 14 are separated by first heating to a temperature sufficient to soften the bonding layer 24. Preferably, the bonding layer 24 is heated to temperatures of at least about 250° C., preferably at least about 300° C., and more preferably from about 300° C. to about 350° C. These temperature ranges represent the preferred softening points of the bonding layer 24. This heating will cause the bonding layer 24 to soften, at which point the two substrates 12, 14 can be separated by sliding or lifting apart. In a further embodiment, instead of heating to soften the layer 24, the bonding composition can be partially or completely dissolved before separation. Dissolution of the entire layer 24 of bonding material can be achieved by contacting the bonding layer 24 with suitable solvents, including solvents that were part of the original bonding composition prior to drying (described above), as well as N-Methyl-2-pyrrolidone (NMP), dimethyl sulfoxide (DMSO), methylene chloride, dimethylacetamide (DMAC), and mixtures thereof. The solvent can be spin-applied, sprayed, or otherwise dispensed onto the outermost edge 28 of the layer 24, or the wafer stack 10 can be immersed in the solvent. Contact with the solvent is carried out until the layer 24 is sufficiently dissolved to facilitate separation of the substrates 12, 14.

Regardless of the method of separation, any residual bonding composition 24' remaining on the thinned wafer 12' or substrate 14 can be easily removed by rinsing with a suitable solvent followed by spin-drying. Suitable solvents include the original solvent that was part of the composition prior to drying as well as N-Methyl-2-pyrrolidone (NMP), dimethyl sulfoxide (DMSO), methylene chloride, dimethylacetamide (DMAC), and mixtures thereof. Any composition 24' remaining behind will be completely dissolved (at least about 98%, preferably at least about 99%, and more preferably about 100%) after about 5-15 minutes of exposure to the solvent. It is also acceptable to remove any remaining bonding composition 24' using a plasma etch, either alone or in combination with a solvent removal process. However, it is preferred that no dry etching be carried out to remove the remaining bonding composition 24'. After this step, a clean, bonding composition-free wafer 12' and carrier substrate 14 (not shown in their clean state) will remain.

EXAMPLES

The following examples set forth preferred methods in accordance with the invention. It is to be understood, however, that these examples are provided by way of illustration and nothing therein should be taken as a limitation upon the overall scope of the invention.

Example 1

Thermoplastic Polyurethane Bonding Compositions

Formulations were each made by dissolving a diisocyanate chain extender, a diol oligomer/monomer, and a catalyst (trioctylamine, 1% by weight of total solids) in cyclopentanone to a 25% by weight solids concentration. Each formulation is provided in Table 1 below.

TABLE 1

Thermoplastic polyurethane bonding compositions

| Formulation | Chain Extender | Diol Oligomer/Monomer | Mw |
|---|---|---|---|
| 1A | <br>4,4'-methylenebis(phenyl isocyanate)<br>10.000 g | <br>α,α'-bis(4-hydroxyphenyl)-1,4-diisopropylbenzene<br>13.840 g | 12,141 |

TABLE 1-continued

Thermoplastic polyurethane bonding compositions

| Formulation | Chain Extender | Diol Oligomer/Monomer | Mw |
|---|---|---|---|
| 1B | 4,4'-methylenebis(phenyl isocyanate) 0.533 g |  Poly(ethylene glycol)-block-poly(propylene glycol)-block-poly(ethylene glycol) Mn = 2800 5.000 g | 29,800 |
| 1C |  Poly(propylene glycol), tolylene 2,4-diisocyanate terminated Mn = 2300 4.576 g |  Poly(ethylene glycol)-ran-poly(propylene glycol) Mn = 2500 5.000 g | 34,000 |

All chemicals were obtained from Sigma-Aldrich, St. Louis, MO.

The formulations were then each applied to a silicon wafer by spin coating at 1,000 rpm for 60 seconds, followed by baking at 120° C. for 10 min. to evaporate solvent. Each wafer was then contacted with a carrier wafer under vacuum at <0.1 psi and 120° C. The bonding layer was then polymerized at 100° C. for 2 hours under vacuum at <0.1 psi to bond the wafers together. The wafers were debonded at room temperature using a ZoneBOND® debonder manufactured by Brewer Science, Inc. by peeling the wafers apart. For molecular weight (weight average, Mw) measurement of the chain extended polymer, small samples were obtained from the bonding layer once the wafers were debonded. The samples were then dissolved in N-Methyl-2-pyrrolidone (NMP) for gel permeation chromatography.

Example 2

Polyhydroxyether Bonding Compositions

Formulations were each made by dissolving a diglycidyl ether chain extender, a diol oligomer/monomer and a catalyst (ethyltriphenyl phosphonium acetate, 1% by weight of total solids) in cyclopentanone to a 25% by weight solids concentration. Each formulation is provided in Table 2 below.

TABLE 2

Polyhydroxyether bonding compositions

| Formulation | Chain Extender | Diol Oligomer/Monomer | Mw |
|---|---|---|---|
| 2A | Dow ® DER 332 (epoxy resin) 2.000 g |  Bisphenol A 1.341 g | 12,990 |

TABLE 2-continued

Polyhydroxyether bonding compositions

| Formulation | Chain Extender | Diol Oligomer/Monomer | Mw |
|---|---|---|---|
| 2B | Resorcinol diglycidyl ether<br>2.566 g | Bisphenol M<br>4.000 g | 14,700 |
| 2C | Dow ® DER 332<br>2.000 g | Bisphenol S<br>1.470 g | 19.568 |

All chemicals were obtained from Sigma-Aldrich, St. Louis, MO, except where indicated.

The formulations were then each applied to a silicon wafer by spin coating at 1,000 rpm for 60 seconds, followed by baking at 120° C. for 10 min. to evaporate solvent. Each wafer was then contacted with a carrier wafer under vacuum at <0.1 psi and 170° C. The bonding layer was then polymerized at 150° C. for 1 hour under vacuum at <0.1 psi to bond the wafers together. The wafers were then debonded at room temperature using a ZoneBOND® debonder manufactured by Brewer Science, Inc. by peeling the wafers apart. For molecular weight (Mw) measurement of the chain extended polymer, small samples of the were obtained from the bonding layer once the wafers were debonded. The samples were then dissolved in NMP for gel permeation chromatography.

Example 3

Polyesteraminde Bonding Compositions

Formulations were made by dissolving a bisoxazoline chain extender and a dicarboxylate oligomer/monomer in cyclopentanone to a 20% by weight solids concentration. Each formulation is provided in Table 3 below.

TABLE 3

Polyesteramide bonding compositions

| Formulation | Chain extender | Dicarboxylate Oligomer/Monomer | Mw |
|---|---|---|---|
| 3A | 2,2'-(1,3-phenylene) bis(2-oxazoline)[1]<br>0.500 g | Reafree 4401-S[2]<br>9.784 g | 44,779 |
| 3B | 2,2'-(1,3-phenylene) bis(2-oxazoline)<br>5.000 g | 2,2-dimethylglutaric acid<br>3.570 g | 8,343 |

TABLE 3-continued

Polyesteramide bonding compositions

| Formulation | Chain extender | Dicarboxylate Oligomer/Monomer | Mw |
|---|---|---|---|
| 3C | 2,2'-(1,3-phenylene) bis(2-oxazoline)<br>5.000 g | <br>Adipic acid<br>3.260 g | 10,518 |

[1] Obtained from TCI America;
[2] Carboxylated polyester resin (Cray Valley).
All other chemicals were obtained from Sigma-Aldrich, St. Louis, MO.

The formulations were then each applied to a silicon wafer by spin coating at 1,000 rpm for 60 seconds, followed by baking at 120° C. for 10 min. to evaporate solvent. Each wafer was then contacted with a carrier wafer under vacuum at <0.1 psi and 200° C. The bonding layer was then polymerized at 180° C. for 1 hour at <0.1 psi to bond the wafers together. The wafers were debonded at room temperature using a ZoneBOND® debonder manufactured by Brewer Science, Inc. by peeling the wafers apart. Small amounts of polymer samples were obtained from the debonded pairs and dissolved in NMP for Mw measurement.

Example 4

Thermoplastic Polyurea Bonding Compositions

+

Formulations were made by dissolving a biscaprolactam chain extender and a diamine oligomer/monomer in cyclopentanone to a 20% by weight solids concentration. Each formulation is provided in Table 4 below.

TABLE 4

Thermoplastic polyurea bonding compositions

| Formulation | Chain extender | Diamine Oligomer/Monomer | Mw |
|---|---|---|---|
| 4A | N,N'-isophthaloyl bis-caprolactam (IBC)[1]<br>1.023 g | <br>4,4'-(9-fluorenylidene)dianiline<br>1.000 g | 29,905 |

TABLE 4-continued

Thermoplastic polyurea bonding compositions

| Formulation | Chain extender | Diamine Oligomer/Monomer | Mw |
|---|---|---|---|
| 4B | IBC[1] 1.648 g | Bis[4-(3-aminophenoxy)phenyl] Sulfone 2.000 g  | 31,840 |
| 4C | IBC[1] 1.829 g | 1,3-Bis(3-aminophenoxy)benzene 1.500 g  | 33,475 |

[1]Obtained from Far Chemicals, Inc., FL; All other chemicals were obtained from Chriskev company, Inc., KS.

The formulations were then each applied to a silicon wafer by spin coating at 1,000 rpm for 60 seconds, followed by baking at 120° C. for 10 min. to evaporate solvent. Each wafer was then contacted with a carrier wafer under vacuum at <0.1 psi and bonding layer was then polymerized at 180° C. for 1 hour at <0.1 psi to bond the wafers together. The wafers were debonded at room temperature using a ZoneBOND® debonder manufactured by Brewer Science, Inc. by peeling the wafers apart. Small amounts of polymer samples were obtained from the debonded pairs and dissolved in NMP for Mw measurement.

Example 5

Thiol-Acrylate Bonding Compositions

Formulations were prepared using the ingredients in Table 5 below.

TABLE 5

Thiol-acrylate bonding compositions

| Formulation | Monomer 1 | Monomer 2 | Photo or Thermal Initiator |
|---|---|---|---|
| 5A | Ethylene bis 3-mercaptopropionate[1] 13.56 g | Ebercryl 600[2] 43.90 g | Irgacure 819[3] 2.39 g |
| 5B | Ethylene bis 3-mercaptopropionate[1] 6.84 g | Ebecryl 600[2] 22.70 g | Dicumyl peroxide[4] 1.2079 g |

[1]Bruno Bock Thiochemicals, Hamburg, Germany;
[2]Diacrylate ester of bisphenol A epoxy resin (Cytec Industries, Inc., Woodland Park, NJ);
[3]Bis(2,4,6-trimethylbenzoyl)-phenylphosphineoxide (BASF);
[4]Sigma-Aldrich.

For Formulation 5A, the components were mixed by hand with a spatula until the initiator dissolved. A 5-gram aliquot was then placed on a 100-mm wafer and heated to 100° C. The hot wafer was transferred to a spin coater and spun at 600 rpm for 30 seconds to form a uniform film. A pre-treated glass carrier wafer (described below) was then placed on the film while heating to 100° C. The wafer pair was then exposed to the UV mask aligner (~30 mW/cm$^2$) for 10 minutes to polymerize the composition.

Formulation 5B was prepared and used to form a uniform film in the same way as Formulation 5A, above, except that a pre-treated silicon carrier wafer (described below) was used instead of a glass carrier. In addition, instead of UV polymerization, the bonding layer of Formulation 5B was polymerized by placing on a hot plate at 200° C. for 1 hour.

The carriers for Formulations 5A and 5B were both pre-treated for release of the polymerized bonding layer. For pre-treatment, 5 mL of a 1% solution of heptadecafluoro-1,1,2,2-tetrahydrodecyl trichlorosilane in Fluorinert FC-40 (3M) was dispensed on each wafer and spincast at 1,250 rpm for 40 seconds (250 rpm/s ramp). The coated carriers were then baked for 1 minute at 100° C. The carriers were then rinsed with 10 mL of Fluorinert FC-40 solvent to remove any excess silane and spun at 1,500 rpm for 10 seconds to dry (1,500 rpm/s ramp).

Each bonded pair was exposed to 250° C. heat by being placed on a hot plate. Both pairs survived a 250° C. temperature exposure on a hot plate without slippage, and no delamination or movement was observed at the edge of each pair, even after pressure was applied. The pairs were separated only after solvent treatment of the edge bond.

We claim:

1. A method of forming a temporary wafer bonding structure, said method comprising:
   providing a first substrate having front and back surfaces, wherein said first substrate is a microelectronic substrate;
   providing a second substrate having front and back surfaces;
   applying a bonding composition to the front surface of at least one of said first and second substrates, said bonding composition comprising a plurality of components optionally dispersed or dissolved in a solvent system, said components having a first weight average molecular weight;
   contacting the front surface of the other of said first and second substrates with said bonding composition; and
   polymerizing said components in said bonding composition to yield a polymerized layer between said first and second substrates, said polymerized layer comprising a plurality of polymerized components having a second weight average molecular weight, said second weight average molecular weight being greater than said first molecular weight, thereby forming said temporary bonding structure.

2. The method of claim 1, wherein said components are selected from the group consisting of monomers, oligomers, and mixtures thereof.

3. The method of claim 1, said second weight average molecular weight being at least about 2 times greater than said first weight average molecular weight.

4. The method of claim 1, wherein said polymerized layer comprises a plurality of polymerized components, said polymerized components comprising a linear polymer.

5. The method of claim 1, wherein said polymerized layer is essentially free of branching or crosslinking.

6. The method of claim 1, wherein said bonding composition has a first viscosity and said polymerized layer has a second viscosity, said second viscosity being greater than said first viscosity.

7. The method of claim 1, wherein said polymerizing comprises subjecting said components to heat or activating radiation.

8. The method of claim 1, wherein said applying comprises spin coating said bonding composition onto the front surface of said first or second substrate.

9. The method of claim 1, wherein said components comprise a terminally reactive compound and a chain extender.

10. The method of claim 9, wherein said terminally reactive compound is selected from the group consisting of diols, dicarboxylic acids, and diamines.

11. The method of claim 9, wherein said terminally reactive compound has a weight average molecular weight of from about 200 to about 20,000 Daltons.

12. The method of claim 9, wherein said chain extender is selected from the group consisting of diisocyanates, diglycidyl ethers, bisoxazolines, biscaprolactums, and compounds endcapped by isocyanate, epoxy, oxazoline, or caprolactam groups.

13. The method of claim 1, wherein said composition is substantially free of crosslinking agents.

14. The method of claim 1, wherein said components are selected from the group consisting of:
   (a) a mixture of: (i) diols or compounds endcapped by —OH groups; and (ii) diisocyanates or compounds endcapped by isocyanate groups;
   (b) a mixture of: (i) diols or compounds endcapped by —OH groups; and (ii) diglycidyl ethers or compounds endcapped by epoxy groups;
   (c) a mixture of: (i) dicarboxylic acids or compounds endcapped by —COOH groups; and (ii) bisoxazolines or compounds endcapped by oxazoline groups;
   (d) a mixture of: (i) diamines or compounds endcapped by —NH, groups; and (ii) biscaprolactams or compounds endcapped by caprolactam groups; and
   (e) a mixture of: (i) diacrylates or compounds endcapped by —OOCCH=CH$_2$ groups; and (ii) dithiols or compounds endcapped by thiol groups.

15. The method of claim 14, wherein said components are mixture (a), said composition further comprising a catalyst selected from the group consisting of stannous octylate, dibutyltin diacetate, dibutyl tin dilaurate, N-methyl-morpholine, and triethylamine.

16. The method of claim 14, wherein said components are mixture (b), said composition further comprising a catalyst selected from the group consisting of quaternary ammonium salts and phosphonium salts.

17. The method of claim 14, wherein said components are mixture (e), said composition further comprising a catalyst selected from the group consisting of stannous octylate, dibutyltin diacetate, dibutyltin dilaurate, -methyl-morpholine, triethylamine, and trioctylamine.

18. The method of claim 1, wherein said first substrate is selected from the group consisting of microelectromechanical system devices, display devices, flexible substrates, compound semiconductors, low k dielectric layers, dielectric layers, ion implant layers, and substrates comprising silicon, aluminum, tungsten, tungsten silicide, gallium arsenide, germanium, tantalum, tantalum nitrite, SiGe, and mixtures of the foregoing.

19. The method of claim 1, wherein said second substrate comprises a material selected from the group consisting of sapphire, ceramic, glass, quartz, aluminum, silver, silicon, glass-ceramic composites, and combinations thereof.

20. The method of claim 1, further comprising subjecting said stack to a process selected from the group consisting of wafer thinning, backgrinding, metallizing, patterning, passivation, and combinations thereof.

21. The method of claim 1, further comprising separating said first and second substrates.

22. The method of claim 21, wherein said separating comprises applying a force to at least one of said first and second substrates while causing the other of said first and second substrates to resist said force, said force being applied in a sufficient amount so as to separate said first and second substrates.

23. The method of claim 21, wherein said separating is carried out at room temperature.

24. The method of claim 21, wherein said front surface of said first substrate after said separating comprises residue of said bonding layer, further comprising contacting said surface with a solvent to remove said residue.

25. The method of claim 1, wherein said polymerized layer comprises polymerized components selected from the group consisting of polyurethanes, polyhydroxyethers, polyesteramides, polyureas, and dithiol diacrylates.

26. A method of forming a temporary wafer bonding structure, said method comprising:
providing a first substrate having front and back surfaces;
applying a bonding composition to the front surface of said first substrate, said bonding composition comprising a plurality of components optionally dispersed or dissolved in a solvent system, said components having a first weight average molecular weight;
providing a second substrate having front and back surfaces;
contacting said front surface of said second substrate with said bonding composition on said first substrate;
polymerizing said components in said bonding composition to yield a polymerized layer between said first and second substrates said polymerized layer comprising a plurality of polymerized components having a second weight average molecular weight, said second weight average molecular weight being greater than said first molecular weight; and
subjecting said back surface of said first substrate to backside processing, thereby forming said temporary bonding structure.

27. The method of claim 26, further comprising separating said first and second substrates.

28. The method of claim 26, wherein said backside processing is selected from the group consisting of wafer thinning, backgrinding, metallizing, patterning, passivation, and combinations thereof.

29. The method of claim 26, wherein said bonding composition comprises less than about 50% by weight polymeric compounds prior to said polymerizing, based upon the total weight of solids in the composition taken as 100% by weight.

30. The method of claim 26, wherein said polymerized layer comprises greater than about 50% by weight polymeric compounds, based upon the total solids in the layer taken as 100% by weight.

* * * * *